United States Patent
Woo et al.

(10) Patent No.: US 10,546,959 B2
(45) Date of Patent: Jan. 28, 2020

(54) TRANSISTOR AND DISPLAY DEVICE HAVING THE SAME

(71) Applicant: SAMSUNG DISPLAY CO., LTD., Yongin-si, Gyeonggi-Do (KR)

(72) Inventors: Sung Wook Woo, Yongin-si (KR); Chang Ho Lee, Yongin-si (KR); Kyung Lae Rho, Yongin-si (KR); Doo Hyoung Lee, Yongin-si (KR); Sung Chan Jo, Yongin-si (KR); Sang Woo Sohn, Yongin-si (KR); Sang Won Shin, Yongin-si (KR); Soo Im Jeong, Yongin-si (KR); Chang Yong Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/662,502

(22) Filed: Jul. 28, 2017

(65) Prior Publication Data

US 2018/0040739 A1    Feb. 8, 2018

(30) Foreign Application Priority Data

Aug. 5, 2016    (KR) .................. 10-2016-0100208

(51) Int. Cl.
*H01L 29/786* (2006.01)
*H01L 29/04* (2006.01)
(Continued)

(52) U.S. Cl.
CPC ...... *H01L 29/78693* (2013.01); *H01L 29/045* (2013.01); *H01L 29/1033* (2013.01);
(Continued)

(58) Field of Classification Search
CPC ..... H01L 29/66568–66659; H01L 29/04–045; H01L 29/7869–78693; H01L 27/3274; H01L 29/78693

See application file for complete search history.

(56) References Cited

U.S. PATENT DOCUMENTS 8,319,218 B2    11/2012    Yamazaki et al.
8,669,556 B2    3/2014    Yamazaki et al.
(Continued)

OTHER PUBLICATIONS

US 9,240,489 B2, 01/2016, Yamazaki et al. (withdrawn)
(Continued)

*Primary Examiner* — Tucker J Wright
(74) *Attorney, Agent, or Firm* — F. Chau & Associates, LLC

(57) ABSTRACT

A transistor includes a gate electrode, a semiconductor layer overlapping the gate electrode, the semiconductor layer including an oxide semiconductor, and a source electrode and a drain electrode spaced apart from the source electrode, wherein the source and drain electrodes are connected to the semiconductor layer. The semiconductor layer includes a plurality of layers, wherein a crystallinity of a layer of the plurality of layers of the semiconductor layer is a ratio of a crystalline oxide semiconductor, included in the layer of the plurality of layers of the semiconductor layer, to an amorphous oxide semiconductor, included in the layer of the plurality of layers of the semiconductor layer. A first layer of the plurality of layers of the semiconductor layer has a different crystallinity with respect to a second layer of the plurality of layers of the semiconductor layer.

19 Claims, 8 Drawing Sheets

(51) Int. Cl.
H01L 29/24 (2006.01)
H01L 29/10 (2006.01)

(52) U.S. Cl.
CPC ...... *H01L 29/247* (2013.01); *H01L 29/78606* (2013.01); *H01L 29/78696* (2013.01)

(56) References Cited

U.S. PATENT DOCUMENTS

| | | | |
|---|---|---|---|
| 8,686,425 B2 | 4/2014 | Yamazaki et al. | |
| 8,753,928 B2 | 6/2014 | Yamazaki et al. | |
| 8,772,768 B2 | 7/2014 | Yamazaki | |
| 8,785,928 B2 | 7/2014 | Yamazaki et al. | |
| 8,841,662 B2 | 9/2014 | Yamazaki et al. | |
| 8,957,414 B2 | 2/2015 | Yamazaki et al. | |
| 8,969,182 B2 | 3/2015 | Koezuka et al. | |
| 8,987,728 B2 | 3/2015 | Honda et al. | |
| 9,006,729 B2 | 4/2015 | Akimoto et al. | |
| 9,076,874 B2 | 7/2015 | Yamazaki et al. | |
| 9,087,700 B2 | 7/2015 | Yamazaki et al. | |
| 9,093,544 B2 | 7/2015 | Yamazaki et al. | |
| 9,245,958 B2 * | 1/2016 | Yamazaki | |
| 2014/0042433 A1 * | 2/2014 | Yamazaki | 257/43 |
| 2015/0107988 A1 | 4/2015 | Yamazaki | |
| 2015/0179805 A1 | 6/2015 | Yamazaki et al. | |

OTHER PUBLICATIONS

T. Chen, et al., "Excimer laser crystallization of InGaZnO4 on SiO2 substrate", J Mater Sci: Mater Electron, 2011, 22, pp. 1694-1696.

K. Nomura, et al., "Amorphous Oxide Semiconductors for High-Performance Flexible Thin-Film Transistors", Jpn. J. Appl. Phys. vol. 45, No. 5B, 2006, pp. 4303-4308.

M. Lee, et al., "Controlling the electrical and the optical properties of amorphous IGZO films prepared by using pulsed laser deposition", J. Korean Phys. Soc. vol. 58, No. 3, Mar. 2011, pp. 492-497.

S. Yamazaki, et al., "Properties of crystalline In—Ga—Zn-oxide semiconductor and its transistor characteristics", Jpn. J. Appl. Phys. 53, 2014, pp. 04ED18-04ED18-10.

* cited by examiner

TRANSISTOR AND DISPLAY DEVICE HAVING THE SAME

CROSS-REFERENCE TO RELATED APPLICATION(S)

The present application claims priority under 35 U.S.C. § 119 to Korean Patent Application No. 10-2016-0100208, filed on Aug. 5, 2016, in the Korean Intellectual Property Office, the disclosure of which is incorporated by reference herein in its entirety.

TECHNICAL FIELD

The present invention relates to a transistor, and more particularly, to a display device having the same.

DISCUSSION OF THE RELATED ART

An active matrix display device uses a transistor as a switching or driving device. The active matrix display device includes a gate line that transmits a scan signal to the transistor and a data line that transmits a data signal to a pixel electrode through the transistor based on the scan signal.

Transistors that operate at a high speed may have a low reliability.

SUMMARY

According to an exemplary embodiment of the present invention, a transistor includes a gate electrode, a semiconductor layer overlapping the gate electrode, the semiconductor layer including an oxide semiconductor, and a source electrode and a drain electrode spaced apart from the source electrode, wherein the source and drain electrodes are connected to the semiconductor layer. The semiconductor layer includes a plurality of layers, wherein a crystallinity of a layer of the plurality of layers of the semiconductor layer is a ratio of a crystalline oxide semiconductor, included in the layer of the plurality of layers of the semiconductor layer, to an amorphous oxide semiconductor, included in the layer of the plurality of layers of the semiconductor layer. A first layer of the plurality of layers of the semiconductor layer has a different crystallinity with respect to a second layer of the plurality of layers of the semiconductor layer.

According to an exemplary embodiment of the present invention, a display device includes a substrate, a first transistor disposed on the substrate, and a light emitting device connected to the first transistor. The first transistor includes a gate electrode, a semiconductor layer overlapping the gate electrode, wherein the semiconductor layer includes an oxide semiconductor, and a source electrode and a drain electrode spaced apart from the source electrode, wherein the source and drain electrodes are connected to the semiconductor layer. The semiconductor layer includes a plurality of layers, wherein a crystallinity of a given layer of the plurality of layers of the semiconductor layer is a ratio of a crystalline oxide semiconductor, included in the given layer of the plurality of layers of the semiconductor layer, to an amorphous oxide semiconductor, included in the given layer of the plurality of layers of the semiconductor layer. A first layer of the plurality of layers of the semiconductor layer has a different crystallinity with respect to a second layer of the plurality of layers of the semiconductor layer.

According to an exemplary embodiment of the present invention, a transistor includes a gate electrode, a first semiconductor layer, a second semiconductor layer and a third semiconductor layer stacked on each other such that the second semiconductor layer is disposed between the first and third semiconductor layers, wherein at least the second and third semiconductor layers, from among a group of the first, second and third semiconductor layers, overlap the gate electrode, and wherein each of the first, second and third semiconductor layers includes an oxide semiconductor, and a source electrode and a drain electrode spaced apart from each other, wherein the source and drain electrodes are connected to the third semiconductor layer. A ratio of a crystalline oxide semiconductor to an amorphous oxide semiconductor included in the third semiconductor layer is higher than a ratio of a crystalline oxide semiconductor to an amorphous oxide semiconductor included in the second semiconductor layer. The ratio of the crystalline oxide semiconductor to the amorphous oxide semiconductor included in the third semiconductor layer is higher than a ratio of a crystalline oxide semiconductor to an amorphous oxide semiconductor included in the first semiconductor layer.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
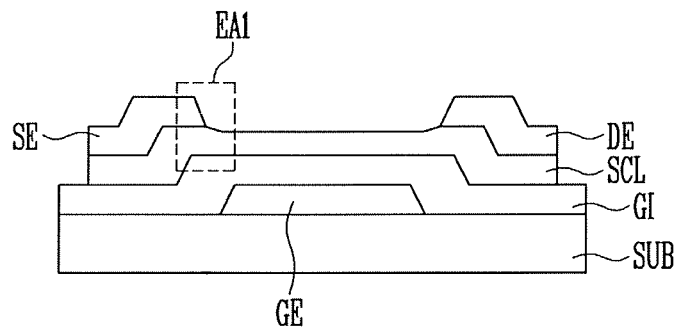
FIG. 1 is a cross-sectional view illustrating a transistor according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. The sizes or proportions of elements illustrated in the drawings may be exaggerated for clarity.

It will be understood that when an element such as a layer or substrate is referred to as being "on" another element, it can be directly on the other element, or intervening elements may also be present therebetween.

Figure 2:
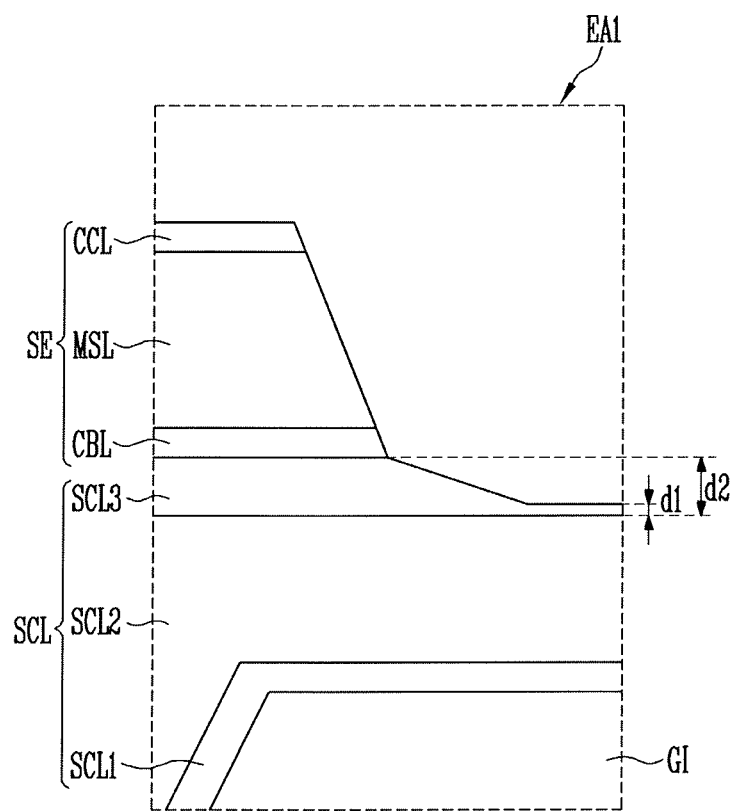
FIG. 2 is an enlarged view of area EA1 of FIG. 1, according to an exemplary embodiment of the present invention.

FIG. 1 is a cross-sectional view illustrating a transistor according to an exemplary embodiment of the present invention. FIG. 2 is an enlarged view of area EA1 of FIG. 1, according to an exemplary embodiment of the present invention.

Referring to FIGS. 1 and 2, a transistor may be disposed on a substrate SUB.

The substrate SUB may include a transparent insulating material such that light can be transmitted through the substrate SUB. The substrate SUB may be a rigid substrate. For example, the substrate SUB may include a glass substrate, a quartz substrate, a glass ceramic substrate, and/or a crystalline glass substrate.

In addition, the substrate SUB may be a flexible substrate. In this case, the substrate SUB may include a film substrate including a polymer organic material and/or a plastic substrate. For example, the substrate SUB may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the materials included in the substrate SUB may be variously changed, and may include, for example, a fiber reinforced plastic (FRP), etc.

A material included in the base substrate SUB may have resistance (e.g., a thermal resistance) to a high processing temperature in a fabrication process.

The transistor may include a gate electrode GE, a semiconductor layer SCL overlapping the gate electrode GE, a source electrode SE connected to a first end of the semiconductor layer SCL, and a drain electrode DE connected to a second end of the semiconductor layer SCL. The source electrode SE and the drain electrode DE may be spaced apart from each other.

The gate electrode GE may be disposed on the substrate SUB. The gate electrode GE may include a conductive material. For example, the gate electrode GE may include aluminum (Al), Al alloy, silver (Ag), tungsten (W), copper (Cu), nickel (Ni), chromium (Cr), molybdenum (Mo), titanium (Ti), platinum (Pt), tantalum (Ta), neodymium (Nd), and/or scandium (Sc), and/or an alloy thereof.

A gate insulating layer GI may be disposed over the gate electrode GE to insulate the semiconductor layer SCL and the gate electrode GE from each other.

The gate insulating layer GI may have a single-layered or a multi-layered structure. In addition, the gate insulating layer GI may include an inorganic insulating material and/or an organic insulating layer. For example, when the gate insulating layer GI has a single-layered structure including an inorganic insulating material, the gate insulating layer GI may include a silicon oxide layer, a silicon nitride layer, or a silicon oxyntride layer. When the gate insulating layer GI has a multi-layered structure including an inorganic insulating material, the gate insulating layer GI may have a multi-layered structure in which at least one silicon oxide layer and at least one silicon nitride layer are alternately stacked. When the gate insulating layer GI has a single-layered structure including an organic insulating material, the gate insulating layer GI may include acryl, polyimide (PI), polyamide (PA), and/or benzocyclobutene (BCB). When the gate insulating layer GI has a multi-layered structure including an organic insulating material, the gate insulating layer GI may have a structure in which a plurality of organic insulating layers including acryl, polyimide (PI), polyamide (PA), and/or benzocyclobutene (BCB) are stacked. In addition, the gate insulating layer GI may have a structure in which at least one inorganic insulating layer and at least one organic insulating layer are alternately stacked.

The semiconductor layer SCL may be disposed on the gate insulating layer GI. The semiconductor layer SCL may include an oxide semiconductor. The oxide semiconductor may include a one-component metal oxide, a two-component metal oxide, a three-component metal oxide and/or a four-component metal oxide. The one-compound metal oxide may include indium oxide (InO), tin oxide (SnO) and/or zinc oxide (ZnO). The two-component metal oxide may include an In—Zn-based oxide, a Sn—Zn-based oxide, an Al—Zn-based oxide, a Zn—Mg-based oxide, a Sn—Mg-based oxide, an In—Mg-based oxide and/or an In—Ga-based oxide. The three-component metal oxide may include an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide and/or an In—Lu—Zn-based oxide. The four-component metal oxide may include an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide and/or an In—Hf—Al—Zn-based oxide. For example, the semiconductor layer SCL may include an indium-gallium-zinc oxide (IGZO) in the In—Ga—Zn-based oxide.

In addition, the semiconductor layer SCL may include a source region and a drain region. The source and drain regions are respectively in contact with the source electrode SE and the drain electrode DE. A region of the semiconductor layer SCL between the source region and the drain region may be a channel region.

The semiconductor layer SCL may include a plurality of layers having different crystallinities. The crystallinity may refer to a ratio of a crystalline oxide semiconductor included in a mixture of an amorphous oxide semiconductor and the crystalline oxide semiconductor. For example, the crystallinity of a given layer (e.g., of a given semiconductor layer) included in the semiconductor layer SCL may be the ratio of a crystalline oxide semiconductor included in the given layer to an amorphous oxide semiconductor included in the given layer. The crystallinity of the uppermost layer, from among the plurality of layers of the semiconductor layer SCL, may be higher than the crystallinity of the other layers of the semiconductor layer SCL.

For example, the semiconductor layer SCL may include a first layer SCL1 disposed on the gate insulating layer GI, the first layer SCL1 having a first crystallinity. The semiconductor layer SCL may include a second layer SCL2 disposed on the first layer SCL1, the second layer SCL2 having a second crystallinity higher than the first crystallinity. The semiconductor layer SCL may include a third layer SCL3 disposed on the second layer SCL2, the third layer SCL3 having a third crystallinity higher than the second crystallinity.

The first layer SCL1 may be the lowermost layer of the semiconductor layer SCL. A thickness of the first layer SCL1 may be about 10% to about 20% of the entire thickness of the semiconductor layer SCL. The first crystallinity may be 0%. For example, the first layer SCL1 may include an amorphous oxide semiconductor but the first layer SCL1 might not include a crystalline oxide semiconductor.

The third layer SCL3 may be the uppermost layer of the semiconductor layer SCL. A thickness of the third layer SCL may be about 20% to about 30% of the entire thickness of the semiconductor layer SCL. The third crystallinity may be 100%. For example, the third layer SCL3 may include a crystalline oxide semiconductor but the third layer SCL3 might not include an amorphous oxide semiconductor. For example, the third layer SCL3 may include a crystalline oxide semiconductor including crystals having a c-axis substantially perpendicular to a surface thereof.

In addition, a thickness d1 of a first portion of the third layer SCL3, (e.g., a region of the third layer SCL3 overlapping with gate electrode GE), may be smaller than a thickness d2 of a second portion of the third layer SCL3. The second portion of the third layer SCL3, might not, for example, overlap the gate electrode GE. For example, the thickness d1 of the first portion of the third layer SCL3, overlapping the gate electrode GE, may be 0% to about 10% of the thickness d2 of the second portion of the third layer SCL3.

The second layer SCL2 may be an intermediate layer of the semiconductor layer SCL, which is disposed between the first layer SCL1 and the third layer SCL3. A thickness of the second layer SCL2 may be about 50% to about 70% of the entire thickness of the semiconductor layer SCL. The second crystallinity may range from 0% to about 100%. For example, the second layer SCL2 may include an amorphous oxide semiconductor and a crystalline oxide semiconductor mixed therein.

In (e.g., within) the second layer SCL2, the crystallinity of the second layer SCL2 may vary depending on the region of the second layer SCL2. For example, in the second layer SCL2, the crystallinity of the second layer SCL2 may increase in a direction toward the third layer SCL3, and the crystallinity of the second layer SCL2 may decrease in a direction toward the first layer SCL1. For example, the crystallinity of a first region of the second layer SCL2, adjacent to the third layer SCL3, may be higher than the crystallinity of a second region of the second layer SCL2, adjacent to the first layer SCL1. For example, a volume of the crystalline oxide semiconductor in the first region in the second layer SLC2, adjacent to the third layer SLC3, may be larger than a volume of the crystalline oxide semiconductor in the second region in the second layer SCL2, adjacent to the first layer SCL1.

The source electrode SE and the drain electrode DE may be disposed on the semiconductor layer SCL. The source electrode SE and the drain electrode DE may be connected to the source region and the drain region, respectively. In addition, the source electrode SE and the drain electrode DE may be spaced apart from each other.

The source electrode SE and the drain electrode DE may include a barrier layer CBL, a main wiring layer MSL disposed on the barrier layer CBL, and a capping layer CCL disposed on the main wiring layer MSL.

Hereinafter, the structure of the source electrode SE and the drain electrode DE will be described in detail.

The main wiring layer MSL may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd) and/or scandium (Sc), and/or an alloy thereof. For example, the main wiring layer MSL may include a low resistance material such as copper (Cu) or a copper alloy.

The barrier layer CBL may prevent a material included in the main wiring layer MSL from being diffused into the semiconductor layer SCL. The barrier layer CBL may include a transparent conductive oxide. For example, the barrier layer CBL may include an indium-zinc oxide (IZO), a gallium-zinc oxide (GZO) or an aluminum-zinc oxide (AZO).

The capping layer CCL may prevent oxidation of the main wiring layer MSL. The capping layer CCL may include the same material as the barrier layer CBL. For example, the capping layer CCL may include an indium-zinc oxide (IZO), a gallium-zinc oxide (GZO) or an aluminum-zinc oxide (AZO).

An etch rate of the capping layer CCL is lower than an etch rate of the main wiring layer MSL. The etch rate of the capping layer CCL may be higher than the etch rate of the barrier layer CBL. When the etch rate of the capping layer CCL is higher than the etch rate of the main wiring layer MSL and lower than the etch rate of the barrier layer CBL, an etched amount of the capping layer CCL may be larger than an etched amount of the main wiring layer MSL in a patterning process for forming the source electrode SE and the drain electrode DE. When the etched amount of the capping layer CCL is larger than the etched amount of the main wiring layer MSL, the capping layer CCL might not sufficiently cover the main wiring layer MSL. Therefore, the oxidation preventing function of the capping layer CCL may be lowered.

In the transistor described above, the semiconductor layer SCL includes an oxide semiconductor, and at least a portion of the oxide semiconductor may be a crystalline oxide semiconductor. Thus, since the transistor can operate at a high speed, the transistor can be applied to switching devices, driving devices and/or drivers of active matrix display devices.

FIGS. 3 to 6 are cross-sectional views illustrating a fabrication method of the transistor shown in FIGS. 1 and 2, according to an exemplary embodiment of the present invention.

Figure 3:
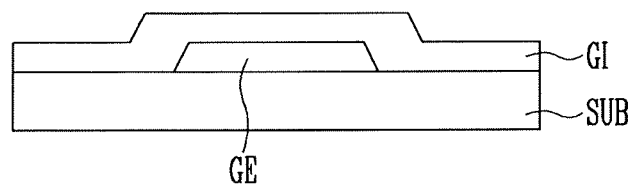
FIGS. 3 to 6 are cross-sectional views illustrating a fabrication method of the transistor shown in FIGS. 1 and 2, according to an exemplary embodiment of the present invention.

Referring to FIG. 3, a substrate SUB is prepared. The substrate SUB may include a transparent insulating material such that light can be transmitted through the substrate SUB. The substrate SUB may be rigid or flexible.

In addition, a material included in the base substrate SUB may have resistance (e.g., a thermal resistance) to a high processing temperature in a fabrication process.

After the substrate SUB is prepared, a conductive material is deposited on the substrate SUB and then patterned. Accordingly, a gate electrode GE may be formed on the substrate SUB. The gate electrode GE may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd) and/or scandium (Sc), and/or an alloy thereof.

After the gate electrode GE is formed, a gate insulating layer GI is formed on the substrate SUB on which the gate electrode GE is formed. The gate insulating layer GI may have a single-layered structure or a multi-layered structure.

In addition, the gate insulating layer GI may include an inorganic insulating material and/or an organic insulating material.

Figure 4:
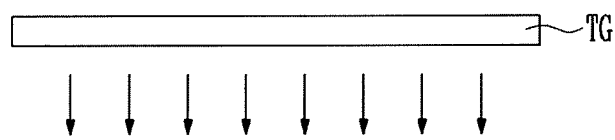
Figure 4:
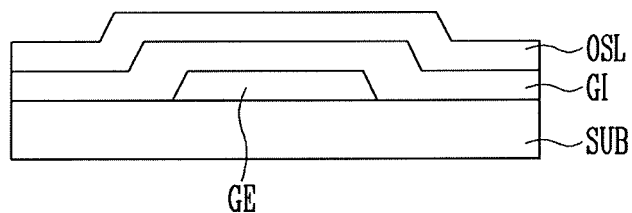

Referring to FIG. 4, an oxide semiconductor layer OSL is formed on the gate insulating layer GI. The oxide semiconductor layer OSL may include a one-component metal oxide, a two-component metal oxide, a three-component metal oxide and/or a four-component metal oxide. Hereinafter, a case where the oxide semiconductor layer OSL includes an indium-gallium-zinc oxide (IGZO) is described as an example.

The oxide semiconductor layer OSL may be formed through a sputtering process.

A target TG for forming the oxide semiconductor layer OSL in the sputtering process may include indium (In), gallium (Ga), zinc (Zn) and oxygen (O). For example, the target TG may include indium oxide ($In_2O_3$), gallium oxide ($Ga_2O_3$), and zinc oxide (ZnO). The content ratio of indium oxide ($In_2O_3$) to gallium oxide ($Ga_2O_3$) to zinc oxide (ZnO) may be 1:1:2. Alternatively, the content ratio of indium oxide ($In_2O_3$) to gallium oxide ($Ga_2O_3$) to zinc oxide (ZnO) may be 1:1:1. The content ratio of indium (In) to gallium (Ga) to zinc (Zn) and to oxygen (O) may be changed depending on the content ratio of indium oxide ($In_2O_3$) to gallium oxide ($Ga_2O_3$) to zinc oxide (ZnO).

By using the sputtering process, the oxide semiconductor layer OSL may include a plurality of layers having different crystallinities. For example, the oxide semiconductor layer OSL may include a first layer SCL1 disposed on the gate insulating layer GI, the first layer SCL1 having a first crystallinity, a second layer SCL2 disposed on the first layer SCL1, the second layer SCL2 having a second crystallinity higher than the first crystallinity, and a third layer SCL3 disposed on the second layer SCL2, the third layer SCL3 having a third crystallinity higher than the second crystallinity.

The crystallinities of the first layer SCL1, the second layer SCL2, and the third layer SCL3 may be different depending on the processing conditions of the sputtering process. For example, the crystallinity of the oxide semiconductor layer OSL may be changed depending on a partial pressure of the oxygen in the sputtering process, (e.g., a partial pressure of oxygen with respect to the entire process gas including argon (Ar) and oxygen ($O_2$)), an intensity of power applied to the target TG, and a temperature of the substrate SUB on which the oxide semiconductor layer OSL is formed. The temperature of the substrate SUB may be about 100° C. to about 250° C., the intensity of the power may be about 2.0 W/$cm_2$ to about 2.5 W/$cm_2$, and the partial pressure of the oxygen may be about 20% to about 80%.

In the process conditions, as the oxygen partial pressure, the intensity of the power, and the temperature of the substrate SB increases, the crystallinity of the oxide semiconductor layer OSL may increase. For example, as the temperature of the substrate SUB increases, the crystallinity of the oxide semiconductor layer OSL may increase.

The first layer SCL1, the second layer SCL2, and the third layer SCL3 are not formed in separate sputtering processes, but may be consecutively formed in one sputtering process. For example, in the same sputtering process, the first layer SCL1, the second layer SCL2, and the third layer SCL3 may be consecutively formed.

Figure 5:
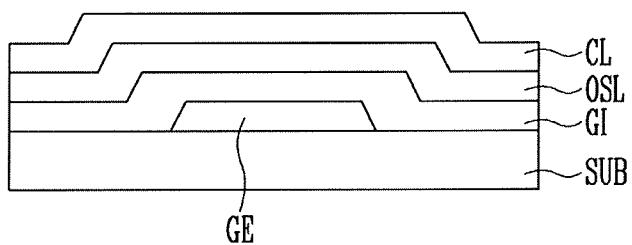

Referring to FIG. 5, after the oxide semiconductor layer (OSL) is formed, a conductive layer CL is formed on the oxide semiconductor layer OSL.

The conductive layer CL, as shown in FIGS. 1 and 2, may include a barrier layer CBL disposed on the oxide semiconductor layer OSL, a main wiring layer MSL disposed on the barrier layer CBL, and a capping layer CCL disposed on the main wiring layer MSL. The barrier layer CBL, the main wiring layer MSL, and the capping layer CCL may be sequentially stacked.

Figure 6:
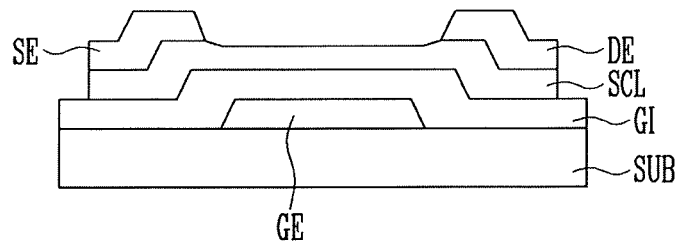

Referring to FIG. 6, the oxide semiconductor layer OSL and the conductive layer CL are patterned to form a semiconductor layer SCL, a source electrode SE, and a drain electrode DE of the transistor.

The patterning of the oxide semiconductor layer OSL and the conductive layer CL may be performed as follows.

A first etching process may be performed to form the semiconductor layer SCL and a conductive pattern, which partially overlap with the gate electrode GE. The conductive pattern may be a portion of the conductive layer CL remaining after the first etching process. The first etching process may be a wet etching process.

After the first etching process is performed, a second etching process is performed to etch a portion of the conductive pattern. The second etching process may be a wet etching process.

In the second etching process, portions of the main wiring layer MSL and the capping layer CCL of the conductive layer CL, which overlap with the gate electrode GE, may be removed. Therefore, the barrier layer CBL, overlapping with the gate electrode GE, may be exposed.

After the second etching process is performed, a third etching process is performed to etch the exposed region of the barrier layer CBL. The third etching process may be a wet etching process or a dry etching process. In the third etching process, a region of the barrier layer CBL, which overlaps with the gate electrode GE, may be removed, and a region of the semiconductor layer SCL, which overlaps with the gate electrode GE, may be exposed.

When the region of the barrier layer CBL, which overlaps with the gate electrode GE, is removed, the conductive pattern may be divided into two regions that do not overlap with the gate electrode GE. The two regions of the conductive pattern may be the source electrode SE and the drain electrode DE, which are disposed at both sides of the semiconductor layer SCL. For example, the transistor including the gate electrode GE, the semiconductor layer SCL, the source electrode SE, and the drain electrode DE may be completed by the third etching process.

In addition, at least a portion of the third layer SCL3 of the semiconductor layer SCL may be removed by the third etching process. For example, a partial thickness of the region of the third layer SCL3, which overlaps with the gate electrode GE, may be removed by the third etching process.

The thickness of the area of the third layer SCL3, which overlaps with the gate electrode GE, may be 0% to about 10% of the entire thickness of the semiconductor layer SCL.

Figure 7:
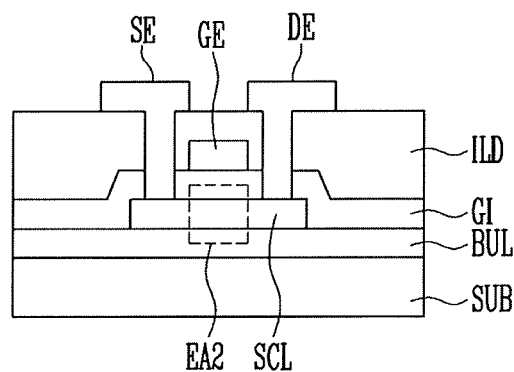
FIG. 7 is a cross-sectional view illustrating a transistor according to an exemplary embodiment of the present invention.
Figure 8:
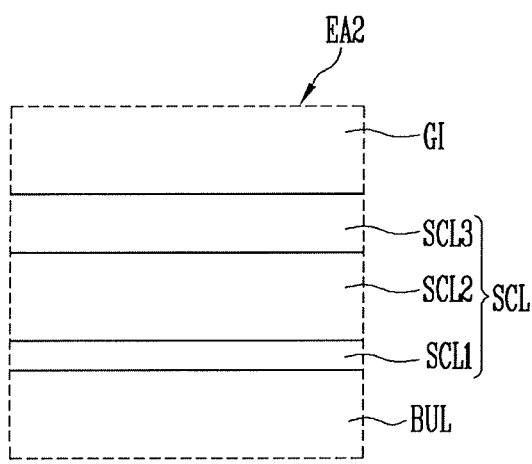
FIG. 8 is an enlarged view of area EA2 of FIG. 7, according to an exemplary embodiment of the present invention.

FIG. 7 is a cross-sectional view illustrating a transistor according to an exemplary embodiment of the present invention. FIG. 8 is an enlarged view of area EA2 of FIG. 7, according to an exemplary embodiment of the present invention.

Referring to FIGS. 7 and 8, a transistor may be disposed on a substrate SUB.

The substrate SUB may include a transparent insulating material such that light can be transmitted through the substrate SUB. The substrate SUB may be a rigid substrate. For example, the substrate SUB may include a glass substrate, a quartz substrate, a glass ceramic substrate, and/or a crystalline glass substrate.

A buffer layer BUL may be disposed between the substrate SUB and the transistor. The buffer layer BUL may have a single-layered structure or a multi-layered structure. The buffer layer BUL may include an inorganic insulating material and/or an organic insulating layer. For example, when the buffer layer BUL has a single-layered structure of an inorganic insulating material, the buffer layer BUL may include a silicon oxide layer, a silicon nitride layer, or a silicon oxyntride layer. When the buffer layer BUL has a multi-layered structure of an inorganic insulating material, the buffer layer BUL may have a multi-layered structure in which at least one silicon oxide layer and at least one silicon nitride layer are alternately stacked. When the buffer layer BUL has a single-layered structure of an organic insulating material, the buffer layer BUL may include acryl, polyimide (PI), polyamide (PA) and/or benzocyclobutene (BCB). When the buffer layer BUL has a multi-layered structure of an organic insulating material, the buffer layer BUL may have a structure in which a plurality of organic insulating layers including acryl, polyimide (PI) polyamide (PA), and/or benzocyclobutene (BCB) are stacked. In addition, the buffer layer BUL may have a structure in which at least one inorganic insulating layer and at least one organic insulating layer are alternately stacked.

The buffer layer BUL prevents impurities from being diffused into the transistor, and prevents moisture and oxygen from penetrating into the transistor. The buffer layer BUL may planarize a surface of the substrate SUB. In an exemplary embodiment of the present invention, the buffer layer BUL may be omitted.

The transistor may include a gate electrode GE, a semiconductor layer SCL having at least a portion overlapping with the gate electrode GE, a source electrode SE connected to a first end of the semiconductor layer SCL, and a drain electrode DE connected to a second end of the semiconductor layer SCL.

Hereinafter, the transistor will be described in detail.

The semiconductor layer SCL may be disposed on the buffer layer BUL. The semiconductor layer SCL may include an oxide semiconductor.

The semiconductor layer SCL may include a plurality of layers having different crystallinities. For example, the semiconductor layer SCL may include a first layer SCL1 disposed on the buffer layer BUL, the first layer SCL1 having a first crystallinity, a second layer SCL2 disposed on the first layer SCL1, the second layer SCL2 having a second crystallinity higher than the first crystallinity, and a third layer SCL3 disposed on the second layer SCL2, the third layer SCL3 having a third crystallinity higher than the second crystallinity.

A thickness of the first layer SCL1 may be about 10% to about 20% of the entire thickness of the semiconductor layer SCL. The first crystallinity may be 0%.

A thickness of the third layer SCL3 may be about 10% to about 30% of the entire thickness of the semiconductor layer SCL. The third crystallinity may be about 100%. For example, the third layer SCL3 may include a crystalline oxide semiconductor including crystals having a c-axis substantially perpendicular to a surface thereof.

A thickness of the second layer SCL2 may be about 50% to about 70% of the entire thickness of the semiconductor layer SCL. The second crystallinity may be 0% to about 100%. In the second layer SCL2, the crystallinity of the second layer SCL2 may increase in a direction toward the third layer SCL3, and the crystallinity of the second layer SCL2 may decrease in a direction toward the first layer SCL1.

A gate insulating layer GI may be disposed over the semiconductor layer SCL to insulate the semiconductor layer SCL and the gate electrode GE. The gate insulating layer GI may have a single-layered structure or a multi-layered structure. The gate insulating layer GI may include an inorganic insulating material and/or an organic insulating material.

The gate electrode GE may be disposed on the gate insulating layer GI. The gate electrode GE may overlap with at least a portion of the semiconductor layer SCL. A region of the semiconductor layer SCL, which overlaps with the gate electrode GE, may be a channel region of the transistor. The ends of the channel regions may be a source region and a drain region.

An interlayer insulating layer ILD may be disposed over the gate electrode GE. The interlayer insulating layer ILD may have a single-layered structure or a multi-layered structure. The interlayer insulating layer ILD may include an inorganic insulating material and/or an organic insulating material.

The source electrode SE and the drain electrode DE may be disposed on the interlayer insulating layer ILD. The source electrode SE and the drain electrode DE may pass through the gate insulating layer GI and the interlayer insulating layer ILD to be connected to the semiconductor layer SCL. The source electrode SE and the drain electrode DE may pass through contact holes that respectively expose the source and drain regions of the semiconductor layer SCL.

Figure 9:
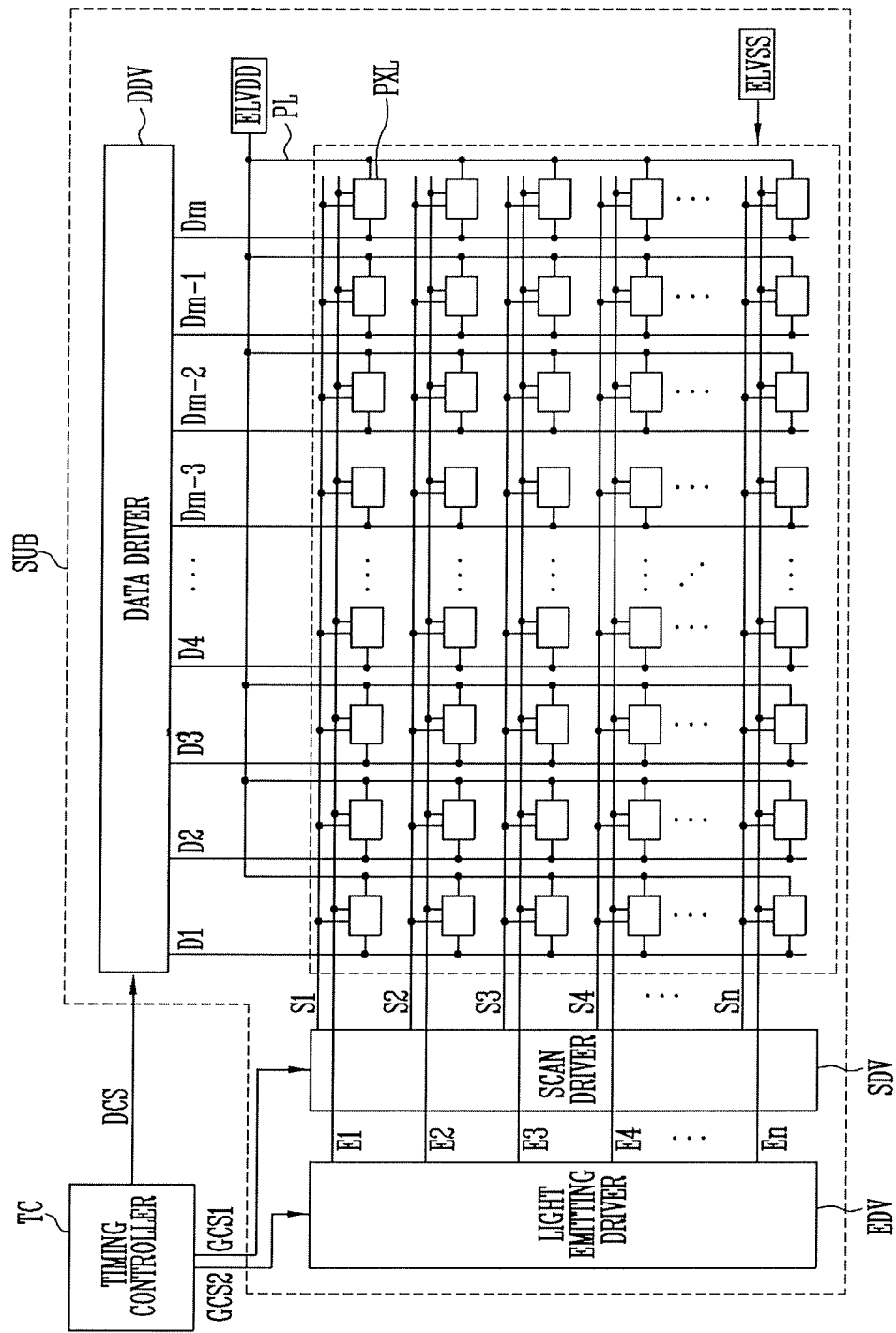
FIG. 9 is a block diagram illustrating pixels and a driving unit of a display device, according to an exemplary embodiment of the present invention.

FIG. 9 is a block diagram illustrating pixels and a driving unit of a display device, according to an exemplary embodiment of the present invention.

Referring to FIG. 9, a display device may include a plurality of pixels PXL, a driving unit and a wiring unit.

The driving unit may include a scan driver circuit SDV, a light emitting driver circuit EDV, a data driver circuit DDV, and a timing controller circuit TC. In FIG. 9, the locations of the scan driver circuit SDV, the light emitting driver circuit EDV, the data driver circuit DDV and the timing controller circuit TC are merely exemplary. For example, the scan driver circuit SDV, the light emitting driver circuit EDV, the data driver circuit DDV, and the timing controller circuit TC may be disposed at different locations of the display device.

The wiring unit may be used to transfer signals from the driving unit to each pixel PXL. The wiring unit may include scan lines, data lines, light emitting control lines, a power line PL, and an initialization power line. The scan lines may include a plurality of scan lines S1 to Sn, and the light emitting control lines may include a plurality of light emitting control lines E1 to En. The data lines may include a plurality of data lines D1 to Dm. The data lines D1 to Dm and the power line PL may be connected to the pixels PXL.

The pixels PXL may be arranged in a pixel area of the display device. The pixels PXL may be connected to the scan lines S1 to Sn, the light emitting control lines E1 to En, the data lines D1 to Dm, and the power line PL. The pixels PXL may be supplied with a data signal from the data lines D1 to Dm when a scan signal is supplied to the scan lines S1 to Sn.

In addition, the pixels PXL may be supplied with a first power source ELVDD, a second power source ELVSS, and an initialization power source from another circuit. The first power source ELVDD may be applied through the power line PL.

Each of the pixels PXL may include a driving transistor and a light emitting device. The driving transistor may control the amount of current flowing into the second power source ELVSS through the light emitting device from the first power source ELVDD, using the data signal.

The scan driver circuit SDV may supply a scan signal to the scan lines S1 to Sn. The scan signal may be based on a first gate control signal GCS1 that the scan driver circuit SDV receives from the timing controller circuit TC. For example, the scan driver circuit SDV may sequentially supply the scan signal to the scan lines S1 to Sn. When the scan signal is sequentially supplied to the scan lines S1 to Sn, pixels PXL may be sequentially selected in units of horizontal lines.

The light emitting driver circuit EDV may supply a light emitting control signal to the light emitting control lines E1 to En. The light emitting control signal may be based on a second gate control signal GCS2 that the light emitting driver circuit EDV receives from the timing controller circuit TC. For example, the light emitting driver circuit EDV may sequentially supply the light emitting control signal to the light emitting control lines E1 to En.

The light emitting control signal may be set to have a wider width than the scan signal (e.g., to be transmitted for a longer period of time than the scan signal). For example, the light emitting control signal supplied to an i-th (e.g., i is a positive integer) light emitting control line Ei may at least partially overlap with a scan signal supplied to an (i−1)th scan line Si−1 and a scan signal supplied to an i-th scan line Si. For example, the time in which the light emitting control signal is supplied to an i-th light emitting control line Ei may at least partially overlap with the time in which a scan signal is supplied to an (i−1)th scan line Si−1 and the time in which a scan signal is supplied to an i-th scan line Si.

Additionally, the light emitting control signal may be set to a gate-off voltage (e.g., a high voltage) such that the transistors included in the pixels PXL can be turned off, and the scan signal may be set to a gate-on voltage (e.g., a low voltage) such that the transistors included in the pixels PXL can be turned on.

The data driver circuit DDV may supply a data signal to the data lines D1 to Dm, based on a data control signal DCS. The data signal supplied to the data lines D1 to Dm may be supplied to pixels PXL selected by the scan signal.

The timing controller circuit TC may respectively supply gate control signals GCS1 and GCS2, which are generated based on timing signals supplied from another circuit, to the scan driver circuit SDV and the light emitting driver circuit EDV. The timing controller circuit TC may supply the data control signal DCS to the data driver circuit DDV.

Each of the gate control signals GCS1 and GCS2 may include a start pulse and clock signals. The start pulse may control timing of a first scan signal and a first light emitting control signal. The clock signals may be used to shift the start pulse.

The data control signal DCS may include a source start pulse and clock signals. The source start pulse may control a sampling start time of data. The clock signals may be used to control a sampling operation.

Figure 10:
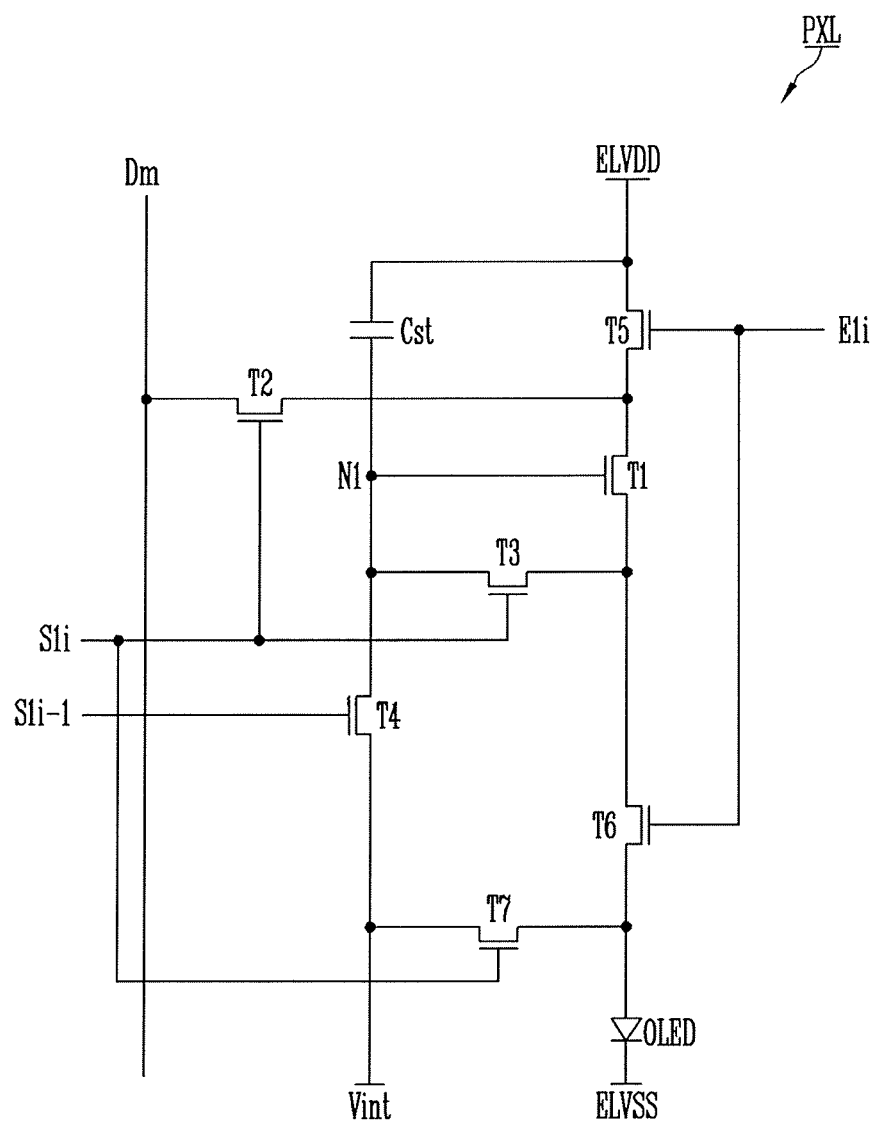
FIG. 10 is an equivalent circuit diagram illustrating a pixel of the display device shown in FIG. 9, according to an exemplary embodiment of the present invention.

FIG. 10 is an equivalent circuit diagram illustrating a pixel of the display device shown in FIG. 9, according to an exemplary embodiment of the present invention. For convenience of description, a pixel connected to an m-th data line Dm and an i-th scan line Si is illustrated in FIG. 10.

Referring to FIG. 10, a pixel PXL of the display device may include a light emitting device OLED, first to seventh transistors T1 to T7, and a storage capacitor Cst. The light emitting device OLED may be, for example, a light emitting diode. The light emitting diode may be, for example, an organic light emitting diode.

An anode of the light emitting device OLED may be connected to the first transistor T1 through the sixth transistor T6, and a cathode of the light emitting device OLED may be connected to the second power source ELVSS. The light emitting device OLED may generate light with a predetermined luminance level, the luminance level corresponding to the amount of current supplied from the first transistor T1.

The first power source ELVDD may be set to a higher voltage than the second power source ELVSS such that current can flow through the light emitting device OLED.

The seventh transistor T7 may be connected between an initialization power source Vint and the anode electrode of the light emitting device OLED. A gate electrode of the seventh transistor T7 may be connected to the i-th scan line Si. The seventh transistor T7 may be turned on when a scan signal is supplied to the i-th scan line Si to supply a voltage of the initialization power source Vint to the anode of the light emitting device OLED. The initialization power source Vint may be set to a lower voltage than a data signal.

The sixth transistor T6 may be connected between the first transistor T1 and the light emitting device OLED. A gate electrode of the sixth transistor T6 may be connected to an i-th first light emitting control line E1i. The sixth transistor T6 may be turned on when a light emitting control signal is supplied to the i-th first light emitting control line E1i, and turned off otherwise.

The fifth transistor T5 may be connected between the first power source ELVDD and the first transistor T1. A gate electrode of the fifth transistor T5 may be connected to the i-th first light emitting control line E1i. The fifth transistor T5 may be turned on when the light emitting control signal is supplied to the i-th first light emitting control line E1i, and turned off otherwise.

A first electrode of the first transistor (e.g., driving transistor) T1 may be connected to the first power source ELVDD through the fifth transistor T5, and a second electrode of the first transistor T1 may be connected to the anode of the light emitting device OLED through the sixth transistor T6. A gate electrode of the first transistor T1 may be connected to a first node N1. The first transistor T1 may control the amount of current flowing into the second power source ELVSS through the light emitting device OLED from the first power source ELVDD, based on a voltage of the first node N1.

The third transistor T3 may be connected between the second electrode of the first transistor T1 and the first node N1. A gate electrode of the third transistor T3 may be connected to the i-th scan line Si. The third transistor T3 may be turned on when the scan signal is supplied to the i-th scan line Si to allow the second electrode of the first transistor T1 and the first node N1 to be electrically connected to each other. Therefore, when the third transistor T3 is turned on, the first transistor T1 may be diode-connected.

The fourth transistor T4 may be connected between the first node N1 and the initialization power source Vint. A gate electrode of the fourth transistor T4 may be connected to an (i−1)th first scan line S1i−1. The fourth transistor T4 may be turned on when the scan signal is supplied to the (i−1)th first scan line S1i−1 to supply the voltage of the initialization power source Vint to the first node N1.

The second transistor (e.g., switching transistor) T2 may be connected between the m-th data line Dm and the first electrode of the first transistor T1. A gate electrode of the second transistor T2 may be connected to the i-th scan line Si. The second transistor T2 may be turned on when the scan signal is supplied to the i-th scan line Si to allow the m-th data line Dm and the first electrode of the first transistor T1 to be electrically connected to each other.

The storage capacitor Cst may be connected between the first power source ELVDD and the first node N1. The storage capacitor Cst may store a voltage corresponding to the data signal and a threshold voltage of the first transistor T1.

Figure 11:
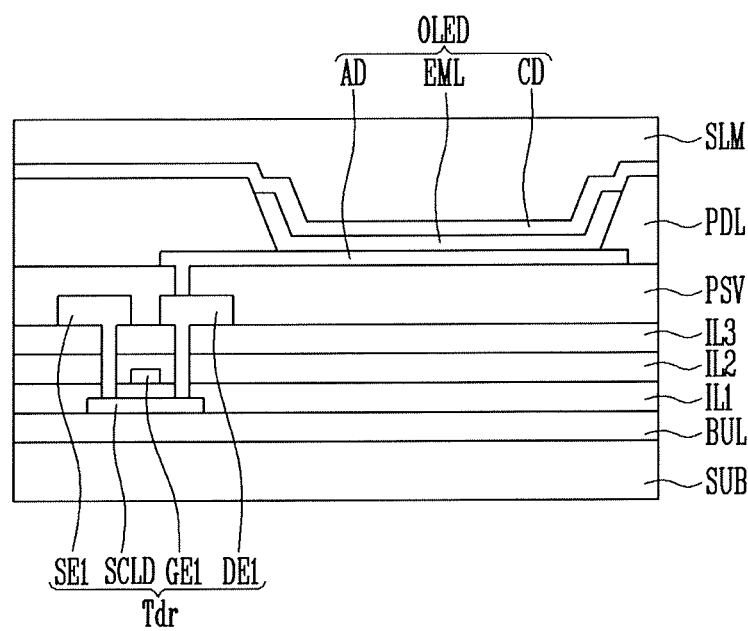
FIGS. 11 to 13 are partial cross-sectional views illustrating a display device according to an exemplary embodiment of the present invention.
Figure 12:
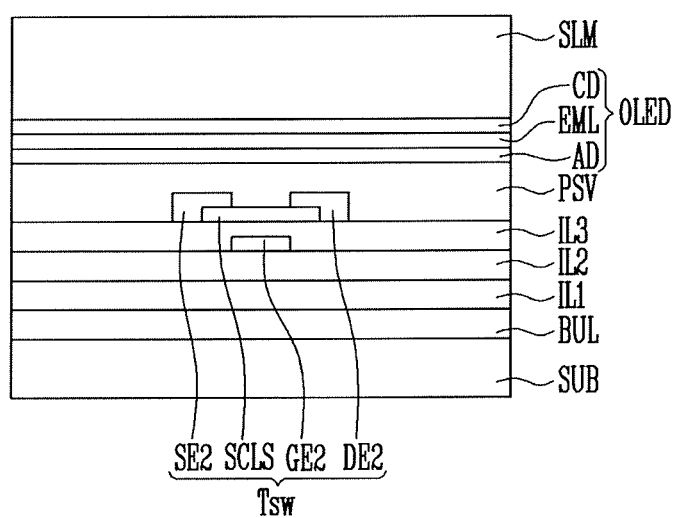
Figure 13:
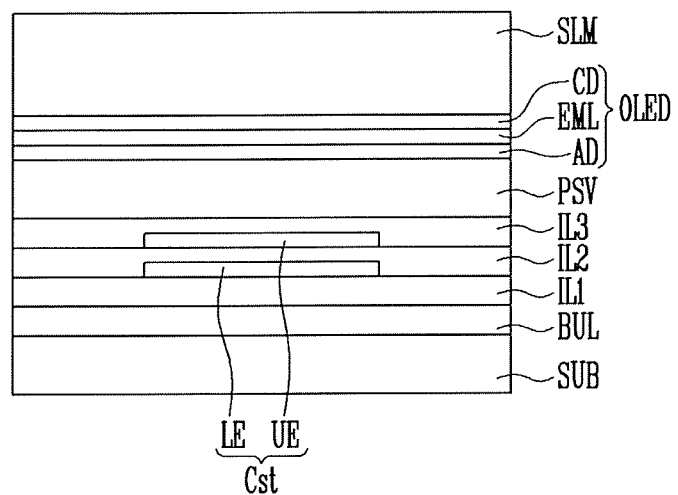

FIGS. 11 to 13 are partial cross-sectional views illustrating a display device according to an exemplary embodiment of the present invention. FIG. 11 is a cross-sectional view illustrating the first transistor shown in FIG. 10, according to an exemplary embodiment of the present invention. FIG. 12 is a cross-sectional view illustrating the second transistor shown in FIG. 10, according to an exemplary embodiment of the present invention. FIG. 13 is a cross-sectional view illustrating the capacitor shown in FIG. 10, according to an exemplary embodiment of the present invention.

Referring to FIGS. 11 to 13, a display device may include a substrate SUB, a driving transistor Tdr, a switching transistor Tsw, a storage capacitor Cst, and a light emitting device OLED.

The driving transistor Tdr, the switching transistor Tsw, and the storage capacitor Cst may be disposed on the substrate SUB. In addition, a buffer layer BUL may be disposed between the substrate SUB and the transistors Tdr and Tsw. The buffer layer BUL may have a single-layered structure or a multi-layered structure. The buffer layer BUL may include an inorganic insulating material and/or an organic insulating material.

The driving transistor Tdr and the switching transistor Tsw may be one of the first to seventh transistors T1 to T7 shown in FIG. 10. For example, the driving transistor Tdr shown in FIG. 11 may be the first transistor T1 of FIG. 10. The switching transistor Tsw shown in FIG. 12 may be the second transistor T2 of FIG. 10.

Hereinafter, stack structures of the driving transistor Tdr and the switching transistor Tsw will be described in more detail.

The driving transistor Tdr may be a PMOS transistor or an NMOS transistor. The driving transistor Tdr may be a top gate transistor, and may include a first semiconductor layer SCLD, a first gate electrode GE1, a first source electrode SE1, and a first drain electrode DE1.

The first semiconductor layer SCLD may be disposed on the buffer layer BUL. The first semiconductor layer SCLD may include amorphous silicon, polycrystalline silicon, and/or single crystalline silicon. For example, the first semiconductor layer SCLD may include polycrystalline silicon.

A first insulating layer IL1 may be disposed over the first semiconductor layer SCLD, and the first gate electrode GE1 may be disposed on the first insulating layer IL1. The first insulating layer IL1 may have a single-layered structure or a multi-layered structure. The first insulating layer IL1 may include an inorganic insulating material and/or an organic insulating material.

A second insulating layer IL2 and a third insulating layer IL3, which are sequentially stacked, may be disposed over the first gate electrode GE1. The second insulating layer IL2 and the third insulating layer IL3 may have a single-layered structure or a multi-layered structure. The second insulating layer IL2 and the third insulating layer IL3 may include an inorganic insulating material and/or an organic insulating material.

The first source electrode SE1 and the first drain electrode DE may be disposed on the third insulating layer IL3. The first source electrode SE1 and the first drain electrode DE may be in contact with the first semiconductor layer SCLD through contact holes passing through the first insulating layer IL1, the second insulating layer IL2, and the third insulating layer IL3.

The switching transistor Tsw may be a bottom gate transistor, and may include a second semiconductor layer SCLS, a second gate electrode GE2, a second source electrode SE2, and a second drain electrode DE2.

The second gate electrode GE2 may be disposed on the second insulating layer IL2. The second semiconductor layer SCLS may be disposed on the third insulating layer IL3.

The second semiconductor layer SCLS may include a plurality of layers having different crystallinities. For example, the second semiconductor layer SCLS may include a first layer SCL1 disposed on the third insulating layer IL3, the first layer SCL1 having a first crystallinity, a second layer SCL2 disposed on the first layer SCL1, the second layer SCL2 having a second crystallinity, and a third layer SCL3 disposed on the second layer SCL2, the third layer SCL3 having a third crystallinity. The first crystallinity may be 0%, the second crystallinity may be 0% to about 100%, and the third crystallinity may be about 100%.

The second source electrode SE2 and the second drain electrode DE2 may be disposed at both ends of the second semiconductor layer SCLS. The second source electrode SE2 and the second drain electrode DE2 may be spaced apart from each other.

The storage capacitor Cst may be the storage capacitor Cst shown in FIG. 10. The storage capacitor Cst may include a lower electrode LE and an upper electrode UE. At least one insulating layer may be disposed between the lower electrode LE and the upper electrode UE. The lower electrode LE may be disposed on the same layer as the first gate electrode GE1. For example, the lower electrode LE may be disposed on the first insulating layer IL1. The lower electrode LE may include the same material as the first gate electrode GE1. The upper electrode UE may be disposed on the same layer as the second gate electrode GE2. For example, the upper electrode UE may be disposed on the second insulating layer IL2. The upper electrode UE may include the same material as the second gate electrode GE2. The insulating layer between the lower electrode LE and the upper electrode UE may be the second insulating layer IL2.

A protective layer PSV may be disposed over the driving transistor Tdr, the switching transistor Tsw, and the storage capacitor Cst.

The protective layer PSV may include at least one layer. The protective layer PSV may include an inorganic protective layer and/or an organic protective layer. For example, the protective layer PSV may include an inorganic protective layer covering the driving transistor Tdr, the switching transistor Tsw, and the storage capacitor Cst, and an organic protective layer disposed on the inorganic protective layer.

The inorganic protective layer may include silicon oxide and/or silicon nitride. In addition, the organic protective layer may include an inorganic insulating material that enables light to be transmitted therethrough. For example, the organic protective layer may include polyacrylate resin, epoxy resin, phenolic resin, polyamide resin, polyimide resin, unsaturated polyester resin, polyphenylene ether resin, polyphenylene sulfide resin, and/or benzocyclobutene resin.

The light emitting device OLED may be disposed on the protective layer PSV. The light emitting device OLED may include a first electrode AD, a second electrode CD, and a emitting layer EML provided between the first electrode AD and the second electrode CD.

One of the first electrode AD and the second electrode CD may be an anode electrode, and the other of the first electrode AD and the second electrode CD may be a cathode electrode. When the driving transistor Tdr is a PMOS transistor, the first electrode AD may be an anode electrode, and the second electrode CD may be a cathode electrode. When the driving transistor Tdr is an NMOS transistor, the first electrode AD may be a cathode electrode, and the second electrode CD may be an anode electrode. Alternatively, when the driving transistor Tdr is an NMOS transistor, the first electrode AD is an anode electrode, and the second electrode CD is a cathode electrode, the first electrode AD may be connected to the first source electrode SE1 of the driving transistor Tdr.

In addition, the first electrode AD and/or the second electrode CD may be a transmissive electrode. For example, when the light emitting device OLED is a bottom emission type organic light emitting device, the first electrode AD may be a transmissive electrode, and the second electrode CD may be a reflective electrode. When the light emitting device OLED is a top emission type organic light emitting device, the first electrode AD may be a reflective electrode, and the second electrode CD may be a transmissive electrode. When the light emitting device OLED is a double-sided emission type organic light emitting device, both of the first electrode AD and the second electrode CD may be transmissive electrodes. In an exemplary embodiment of the present invention, a case where the light emitting device OLED is a top emission type organic light emitting device, and the first electrode AD is an anode electrode is described as an example.

The first electrode AD may be disposed on the protective layer PSV.

The first electrode AD may include a reflective layer that may reflect light, and a transparent conductive layer disposed on the top or bottom of the reflective layer. The transparent conductive layer and/or the reflective layer may be connected to the first source electrode SE1.

The reflective layer may include a material that may reflect light. For example, the reflective layer may include aluminum (Al), silver (Ag), chromium (Cr), molybdenum (Mo), platinum (Pt) and/or nickel (Ni), and/or an alloy thereof.

The transparent conductive layer may include a transparent conductive oxide. For example, the transparent conductive layer may include a transparent conductive oxide, for example, indium tin oxide (ITO), indium zinc oxide (IZO), aluminum zinc oxide (AZO), gallium doped zinc oxide (GZO), zinc tin oxide (ZTO), gallium tin oxide (GTO) and/or fluorine doped tin oxide (FTO).

A pixel defining layer PDL that allows a portion of the first electrode AD, (e.g., a top surface of the first electrode AD to be exposed therethrough) may be disposed on the protective layer PSV. The first electrode AD may be disposed on the pixel defining layer PDL.

The pixel defining layer PDL may include an organic insulating material. For example, the pixel defining layer PDL may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and/or silane based resin.

The emitting layer EML may be disposed on the exposed surface of the first electrode AD. The emitting layer EML may have a multi-layered thin film structure including a light generation layer (LGL). For example, the emitting layer EML may include a hole injection layer (HIL) for injecting holes, a hole transport layer (HTL) having a good hole transporting property, the HTL facilitating the re-combination of holes and electrons by suppressing the movement of electrons that fail to be combined in the LGL. The LGL may emit light through the re-combination of the injected electrons and holes. In addition, the emitting layer EML may include, for example, a hole blocking layer (HBL) for suppressing the movement of holes that fail to be combined in the LGL, an electron transport layer (ETL) for smoothly transporting electrons to the LGL, and an electron transport layer (EIL) for injecting electrons.

The color of light generated in the LGL may be red, green, blue or white, but the present invention is not limited thereto. For example, the color of light generated in the LGL of the emitting layer EML may also be, for example, magenta, cyan or yellow.

The HIL, the HTL, the HBL, the ETL, and the EIL may be common layers connected in adjacent light emitting regions.

The second electrode CD may be disposed on the emitting layer EML. The second electrode CD may be a semi-transmissive reflective layer. For example, the second electrode CD may be a thin metal layer having a given thickness, through which light emitted through the emitting layer EML can be transmitted. The second electrode CD may allow a portion of the light emitted from the emitting layer EML to be transmitted therethrough, and reflect the rest of the light emitted from the emitting layer EML.

The second electrode CD may include a material having a lower work function than the transparent conductive layer. For example, the second electrode CD may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li) and/or calcium (Ca), and/or an alloy thereof.

A portion of the light emitted from the emitting layer EML might not be transmitted through the second electrode CD, and the light reflected from the second electrode CD may be reflected again from the reflective layer. For example, the light emitted from the emitting layer EML may resonate between the reflective layer and the second electrode CD. The light extraction efficiency of the light emitting device OLED can be increased by the resonance of the light.

A distance between the reflective layer and the second electrode CD may be changed depending on a color of the light emitted from the emitting layer EML. For example, the distance between the reflective layer and the second electrode CD may be adjusted to correspond to a distance for creating a resonance of the color of light emitted from the emitting layer EML.

An encapsulation member SLM may be disposed over the second electrode CD. The encapsulation member SLM may isolate the light emitting device OLED from an external environment. Thus, the encapsulation member SLM is disposed over the second electrode CD to prevent moisture and oxygen from penetrating into the light emitting device OLED.

The encapsulation member SLM may be a thin film encapsulation layer including a plurality of organic layers and a plurality of organic layers, which cover the light emitting device OLED. For example, the encapsulation member SLM may have a structure in which the inorganic layers and the organic layers are alternately stacked. In addition, the lowermost and uppermost layers of the encapsulation member SLM may be inorganic layers.

In an exemplary embodiment of the present invention, the encapsulation member SLM may be an encapsulation substrate that is joined with the substrate SUB to seal an internal space of the display device, (e.g., to seal the display device). The encapsulation substrate may be joined with the substrate SUB through a sealant.

Figure 14:
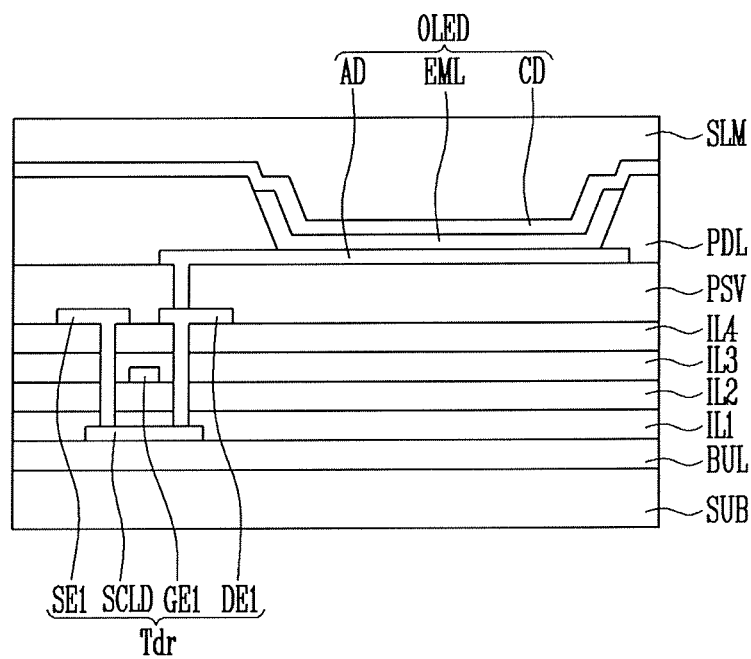
FIGS. 14 to 16 are partial cross-sectional views illustrating a display device according to an exemplary embodiment of the present invention.
Figure 15:
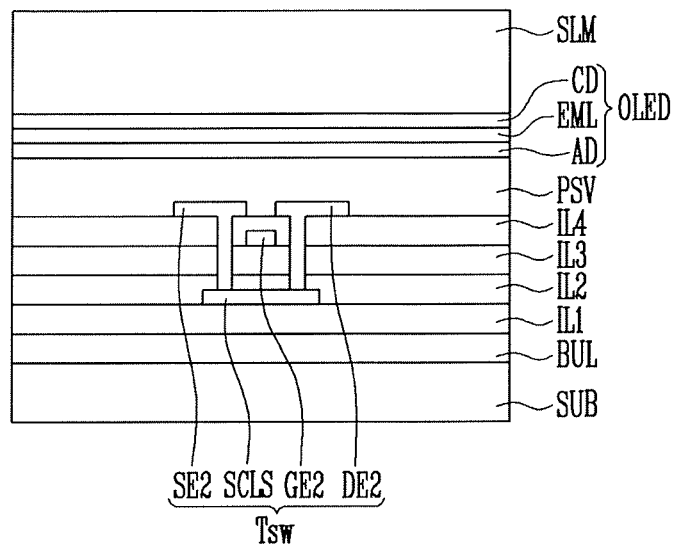
Figure 16:
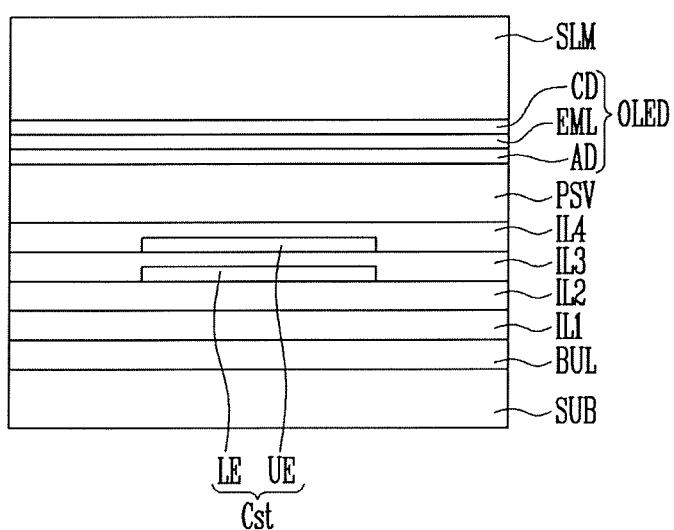

FIGS. 14 to 16 are partial cross-sectional views illustrating a display device according to an exemplary embodiment of the present invention. FIG. 14 is a cross-sectional view illustrating the first transistor shown in FIG. 10, according to an exemplary embodiment of the present invention. FIG. 15 is a cross-sectional view illustrating the second transistor shown in FIG. 10, according to an exemplary embodiment of the present invention. FIG. 16 is a cross-sectional view illustrating the capacitor shown in FIG. 10, according to an exemplary embodiment of the present invention.

Referring to FIGS. 14 to 16, the display device may include a substrate SUB, a driving transistor Tdr, a switching transistor Tsw, a storage capacitor Cst, and a light emitting device OLED.

The driving transistor Tdr, the switching transistor Tsw, and the storage capacitor Cst may be disposed on the substrate SUB. In addition, a buffer layer BUL may be disposed between the substrate SUB and the transistors Tdr and Tsw.

Each of the driving transistor Tdr and the switching transistor Tsw may be one of the first to seventh transistors shown in FIG. 10. For example, the driving transistor Tdr shown in FIG. 14 may be the first transistor T1 of FIG. 10. The switching transistor Tsw shown in FIG. 15 may be the second transistor T2 of FIG. 10.

The driving transistor Tdr may a PMOS transistor or an NMOS transistor. The driving transistor Tdr may be a top gate transistor, and may include a first semiconductor layer SCLD, a first gate electrode GE1, a first source electrode SE1, and a first drain electrode DE1.

The first semiconductor layer SCLD may be disposed on the buffer layer BUL. The first semiconductor layer SCLD may include amorphous silicon, polycrystalline silicon and/or single crystalline silicon. A first insulating layer IL1 and a second insulating layer IL2, which are sequentially stacked, may be disposed over the first semiconductor layer SCLD, and the first gate electrode GE1 may be disposed on the second insulating layer IL2. A third insulating layer IL3 and a fourth insulating layer IL4, which are sequentially stacked, may be disposed over the first gate electrode GE1. The first source electrode SE1 and the first drain electrode DE1 may be disposed on the fourth insulating layer IL4.

The switching transistor Tsw may be a top gate transistor, and may include a second semiconductor layer SCLS, a second gate electrode GE2, a second source electrode SE2, and a second drain electrode DE2.

The second semiconductor layer SCLS may be disposed on the first insulating layer ILL and the second gate electrode GE2 may be disposed on the third insulating layer IL3. The second semiconductor layer SCLS may include a plurality of layers having different crystallinities. For example, the second semiconductor layer SCLS may include a first layer SCL1 disposed on the third insulating layer IL3, the first layer SCL1 having a first crystallinity, a second layer SCL2 disposed on the first layer SCL1, the second layer SCL2 having a second crystallinity, and a third layer SCL3 disposed on the second layer SCL2, the third layer SCL3 having a third crystallinity. The first crystallinity may be 0%, the second crystallinity may be 0% to about 100%, and the third crystallinity may be about 100%.

The second source electrode SE2 and the second drain electrode DE2 may be disposed on the fourth insulating layer IL4. The second source electrode SE2 and the second drain electrode DE2 may be in contact with the second semiconductor layer SCL2 through contact holes passing through the third insulating layer IL3 and the fourth insulating layer IL4.

The storage capacitor Cst may include a lower electrode LE and an upper electrode UE, and at least one insulating layer may be disposed between the lower electrode LE and the upper electrode UE. The lower electrode LE may be disposed on the same layer as the first gate electrode GE1. For example, the lower electrode LE may be disposed on the second insulating layer IL2. The upper electrode UE may be disposed on the same layer as the second gate electrode GE2. For example, the upper electrode UE may be disposed on the third insulating layer IL3. An insulating layer between the lower electrode LE and the upper electrode UE may be the third insulating layer IL3.

A protective layer PSV may be disposed over the driving transistor Tdr, the switching transistor Tsw, and the storage capacitor Cst.

The light emitting device OLED may be disposed on the protective layer PSV. The light emitting device OLED may include a first electrode AD, a second electrode CD, and an emitting layer EML provided between the first electrode AD and the second electrode CD.

One of the first electrode AD and the second electrode CD may be an anode electrode, and the other of the first electrode AD and the second electrode CD may be a cathode electrode. When the driving transistor Tdr is a PMOS transistor, the first electrode AD may be an anode electrode, and the second electrode CD may be a cathode electrode. When the driving transistor Tdr is an NMOS transistor, the first electrode AD may be a cathode electrode, and the second electrode CD may be an anode electrode. Alternatively, when the driving transistor Tdr is an NMOS transistor, the first electrode AD is an anode electrode, and the second electrode CD is a cathode electrode, the first electrode AD may be connected to the first source electrode SE1 of the driving transistor Tdr.

An encapsulation member SLM may be disposed over the second electrode CD. The encapsulation member SLM may isolate the light emitting device OLED from an external environment. Thus, the encapsulation member SLM is disposed over the second electrode CD, to prevent moisture and oxygen from penetrating into the light emitting device OLED.

As described above, according to an exemplary embodiment of the present invention, the transistor may include an oxide semiconductor, and at least a portion of the oxide semiconductor may be a crystalline oxide semiconductor. Thus, since the transistor can operate at high speed, the transistor can be used in a switching device, in a driving device and/or in drivers of active matrix display devices.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. A transistor, comprising:
   a gate electrode;
   a semiconductor layer overlapping the gate electrode, the semiconductor layer including an oxide semiconductor; and
   a source electrode and a drain electrode spaced apart from the source electrode, wherein the source and drain electrodes are connected to the semiconductor layer, wherein the semiconductor layer includes a plurality of layers,
wherein a crystallinity of a layer of the plurality of layers of the semiconductor layer is a ratio of a crystalline oxide semiconductor, included in the layer of the plurality of layers of the semiconductor layer, to an amorphous oxide semiconductor, included in the layer of the plurality of layers of the semiconductor layer, and
wherein the semiconductor layer includes:
a first layer, wherein the first layer has a first crystallinity;
a second layer disposed on the first layer, wherein the second layer has a second crystallinity, wherein the second crystallinity is greater than the first crystallinity; and
a third layer disposed on the second layer, wherein the third layer has a third crystallinity, wherein the third crystallinity is greater than the second crystallinity,
wherein the first layer, the second layer, and the third layer are sequentially stacked.

2. The transistor of claim 1, wherein a thickness of the third layer is about 20% to about 30% of an entire thickness of the semiconductor layer.

3. The transistor of claim 2, wherein the third crystallinity is about 100%.

4. The transistor of claim 2, wherein the third layer includes a first region that overlaps the gate electrode and a second region that does not overlap the gate electrode, wherein a thickness of the first region is smaller than a thickness of the second region.

5. The transistor of claim 4, wherein the thickness of the first region is 0% to about 10% of the thickness of the second region.

6. The transistor of claim 2, wherein the crystalline oxide semiconductor included in the third layer includes crystals, and the crystals have a c-axis.

7. The transistor of claim 6, wherein, in the second layer,
a crystallinity of a region adjacent to the third layer is higher than a crystallinity of a region adjacent to the first layer.

8. The transistor of claim 7, wherein the first crystallinity is 0%.

9. The transistor of claim 8, wherein a thickness of the first layer is about 10% to about 20% of the entire thickness of the semiconductor layer.

10. A display device, comprising:
a substrate;
a first transistor disposed on the substrate; and
a light emitting device connected to the first transistor,
wherein the first transistor includes:
  a gate electrode;
  a semiconductor layer overlapping the gate electrode, wherein the semiconductor layer includes an oxide semiconductor; and
  a source electrode and a drain electrode spaced apart from the source electrode, wherein the source and drain electrodes are connected to the semiconductor layer,
wherein the semiconductor layer includes a plurality of layers,
wherein a crystallinity of a given layer of the plurality of layers of the semiconductor layer is a ratio of a crystalline oxide semiconductor, included in the given layer of the plurality of layers of the semiconductor layer, to an amorphous oxide semiconductor, included in the given layer of the plurality of layers of the semiconductor layer, and wherein a first layer of the plurality of layers of the semiconductor layer has a different crystallinity with respect to a second layer of the plurality of layers of the semiconductor layer,
wherein the semiconductor layer includes:
the first layer, wherein the first layer has a first crystallinity;
the second layer disposed on the first layer, wherein the second layer has a second crystallinity, wherein the second crystallinity is greater than the first crystallinity;
and a third layer disposed on the second layer, wherein the third layer has a third crystallinity, wherein the third crystallinity is greater than the second crystallinity,
wherein the first layer, the second layer, and the third layer are sequentially stacked.

11. The display device of claim 10, wherein the third crystallinity is 100%.

12. The display device of claim 11, wherein a thickness of the third layer is about 20% to about 30% of an entire thickness of the semiconductor layer.

13. The display device of claim 12, wherein the third layer includes a first region that overlaps the gate electrode and a second region that does not overlap the gate electrode, wherein a thickness of the first region is smaller than a thickness of the second region.

14. The display device of claim 12, wherein the crystalline oxide semiconductor included in the third layer includes crystals, and the crystals have a c-axis.

15. The display device of claim 13, wherein, in the second layer,
a crystallinity of a region adjacent to the third layer is higher than a crystallinity of a region adjacent to the first layer.

16. The display device of claim 15, wherein the first crystallinity is 0%, and wherein a thickness of the first layer is about 10% to about 20% of the entire thickness of the semiconductor layer.

17. The display device of claim 16, wherein the light emitting device includes:
a first electrode connected to the transistor;
an emitting layer disposed on the first electrode; and
a second electrode disposed on the emitting layer.

18. A transistor, comprising:
a gate electrode;
a first semiconductor layer, a second semiconductor layer and a third semiconductor layer stacked on each other such that the second semiconductor layer is disposed between the first and third semiconductor layers, wherein at least the second and third semiconductor layers, from among a group of the first, second and third semiconductor layers, overlap the gate electrode, and wherein each of the first, second and third semiconductor layers includes an oxide semiconductor; and
a source electrode and a drain electrode spaced apart from each other, wherein the source and drain electrodes are connected to the third semiconductor layer,
wherein a ratio of a crystalline oxide semiconductor to an amorphous oxide semiconductor included in the third semiconductor layer is higher than a ratio of a crystalline oxide semiconductor to an amorphous oxide semiconductor included in the second semiconductor layer, and
wherein the ratio of the crystalline oxide semiconductor to the amorphous oxide semiconductor included in the third semiconductor layer is higher than a ratio of a crystalline oxide semiconductor to an amorphous oxide semiconductor included in the first semiconductor layer.

19. The transistor of claim 18, wherein the ratio of the crystalline oxide semiconductor to the amorphous oxide semiconductor included in the second semiconductor layer is higher than the ratio of the crystalline oxide semiconductor to the amorphous oxide semiconductor included in the first semiconductor layer.

* * * * *